(12) United States Patent
Hashimoto

(10) Patent No.: US 7,312,145 B2
(45) Date of Patent: Dec. 25, 2007

(54) ELECTRONIC MEMBER, METHOD FOR MAKING THE SAME, AND SEMICONDUCTOR DEVICE

(75) Inventor: Takeshi Hashimoto, Shizuoka (JP)

(73) Assignee: Tomoegawa Paper Co., Ltd., Chuo-Ku, Tokyo (JP)

( * ) Notice: Subject to any disclaimer, the term of this patent is extended or adjusted under 35 U.S.C. 154(b) by 0 days.

(21) Appl. No.: 10/502,129

(22) PCT Filed: Oct. 22, 2003

(86) PCT No.: PCT/JP03/13493

§ 371 (c)(1),
(2), (4) Date: Jul. 19, 2004

(87) PCT Pub. No.: WO2004/038799

PCT Pub. Date: May 6, 2004

(65) Prior Publication Data

US 2005/0067703 A1   Mar. 31, 2005

(30) Foreign Application Priority Data

Oct. 23, 2002 (JP) ............................... 2002-308684

(51) Int. Cl.
*H01L 21/4763* (2006.01)

(52) U.S. Cl. ..................... 438/637; 438/620; 438/638; 438/672

(58) Field of Classification Search ........ 438/618–624, 438/672–674, 637–638; 257/758
See application file for complete search history.

(56) References Cited

U.S. PATENT DOCUMENTS

| 6,586,273 B2 * | 7/2003 | Aiba et al. .................. 438/106 |
| 2003/0075798 A1 * | 4/2003 | Ono ........................... 257/747 |
| 2004/0231141 A1 * | 11/2004 | Nishinaka et al. ............ 29/609 |

FOREIGN PATENT DOCUMENTS

| JP | 61-4257 | 1/1986 |
| JP | 62-122295 | 6/1987 |

(Continued)

OTHER PUBLICATIONS

Japan Patent Office, Office Action in related Japanese Patent Application No. 2002-308684, dated Mar. 6, 2007, (4 pages including translation).

(Continued)

*Primary Examiner*—Dung A. Le
(74) *Attorney, Agent, or Firm*—Wood, Herron & Evans

(57) ABSTRACT

The present invention provides an electronic device having high insulating reliability, in which metal portions of a circuit are not electrically conductive with each other via an adhesive layer even when the electronic device is used in high-temperature low-humidity conditions or high-temperature high-humidity conditions, and provides a production method for the electronic device, and a semiconductor device comprising the electronic device. In the electronic device in which a circuit formed by pattern formation of metal portions is attached via an adhesive layer to an insulating base, the adhesive layer, which contacts adjacent metal portions, is divided. Typically, the electronic device is one of a lead frame having a lead frame fixing tape, a TAB tape, and a flexible printed circuit board.

5 Claims, 3 Drawing Sheets

FOREIGN PATENT DOCUMENTS

| | | |
|---|---|---|
| JP | 63-160393 | 7/1988 |
| JP | 4273157 | 9/1992 |
| JP | 08-238713 | 9/1996 |
| JP | 10-335779 | 12/1998 |
| JP | 11-181233 | 7/1999 |
| JP | 11274692 | 10/1999 |

OTHER PUBLICATIONS

Japanese Patent Office, Notice of Reasons For Rejection for Japanese Application Number 2002-308684, Sep. 10, 2007.

* cited by examiner

ELECTRONIC MEMBER, METHOD FOR MAKING THE SAME, AND SEMICONDUCTOR DEVICE

TECHNICAL FIELD

The present invention relates to an electronic device in which a circuit comprising patterned metal portions are attached via an adhesive layer to an insulating base, a production method therefor, and a semiconductor device using the electronic device.

BACKGROUND ART

A semiconductor device is widely produced using an electronic device comprising a circuit on the surface of an insulating base. Below, the structure of a conventional electronic device will be briefly explained.

An electronic device 100 shown in FIG. 4 comprises an insulating base 110, an adhesive layer 120 which is formed on the entirety of one surface of the insulating base 110, and a circuit 130 which is formed on the surface of the adhesive layer 120. The circuit 130 is produced by pattern formation of metal portions 131 made of copper and the like, and, for example, this is formed by attachment of a metal foil and pattern formation.

If such electronic device or a semiconductor device comprising such an electronic device is used, metal contained in the circuit is ionized and gradually migrates into the adhesive layer. Thereby, there may be cases in which insulation performance decreases and a plurality of metal portions comprising the circuit are electrically conducted to each other via the adhesive layer. This problem is serious when the electronic device or the semiconductor device is used in high-temperature low-humidity conditions or high-temperature high-humidity conditions.

A technique in that the adhesive layer is made of resin compositions, in which when metal contained in a circuit is ionized, it does not readily migrate, has been suggested (for example, Japanese Unexamined Patent Applications, First Publications Nos. Hei 8-238713 and Hei 11-181233). However, when the electronic device or the semiconductor device is used in high-temperature low-humidity conditions or high-temperature high-humidity conditions, the problem is not sufficiently solved by merely changing the compositions of the adhesive layer.

DISCLOSURE OF INVENTION

In consideration of the problem, it is an object of the present invention to provide an electronic device which has high insulating reliability in which a plurality of metal portions of the circuit are not electrically conductive with each other via the adhesive layer even when the electronic device is used in high-temperature low-humidity conditions or high-temperature high-humidity conditions, a production method for the electronic device, and a semiconductor device comprising the electronic device.

Therefore, the present invention provides an electronic device, in which a circuit formed by pattern formation of metal portions is attached via an adhesive layer to an insulating base, wherein the adhesive layer, which contacts adjacent metal portions, is divided.

Typically, the electronic device is one of a lead frame comprising a lead frame fixing tape, a TAB tape, and a flexible printed circuit board.

The present invention provides a production method for an electronic device, in which a circuit formed by pattern formation of metal portions is attached via an adhesive layer to an insulating base, comprising the steps of: forming a layered product comprising the insulating base, the adhesive layer of which is not pattern formed yet, and the circuit which is formed by pattern formation of metal portions, which are layered in this order; and irradiating with a laser, which can selectively eliminate the adhesive layer, from the circuit side on the layered product, so that the adhesive layer, which contacts adjacent metal portions, is divided.

Typically, the laser is an excimer laser.

The present invention provides another production method for an electronic device, in which a circuit formed by pattern formation of metal portions is attached via an adhesive layer to an insulating base, comprising the steps of: forming a layered product comprising the insulating base, the adhesive layer of which is not pattern formed yet, and the circuit which is formed by pattern formation of metal portions, which are layered in this order; and selectively irradiating with a laser on the adhesive layer between adjacent metal portions, so that the adhesive layer, which contacts the adjacent metal portions, is divided.

The present invention provides another production method for an electronic device, in which a circuit formed by pattern formation of metal portions is attached via an adhesive layer to an insulating base, comprising the steps of: forming the adhesive layer by pattern formation on the circuit which is formed by pattern formation of metal portions; and attaching the insulating base on the adhesive layer.

Typically, the adhesive layer is pattern formed by a printing method or a dispensing method.

The present invention also provides another production method for an electronic device, in which a circuit formed by pattern formation of metal portions is attached via an adhesive layer to an insulating base, comprising the steps of: forming the adhesive layer by pattern formation on the surface of the insulating base such that the adhesive layer, which contacts adjacent metal portions of a circuit to be fixed, is divided; and forming the circuit via the adhesive layer on the insulating base.

Typically, the adhesive layer is pattern formed by a printing method or a dispensing method.

The present invention further provides a semiconductor device comprising the electronic device.

The present invention provides an electronic device, which has high insulating reliability, in which metal portions of the circuit are not electrically conductive with each other via the adhesive layer even when the electronic device is used in high-temperature low-humidity conditions or high-temperature high-humidity conditions, and a production method for the electronic device. In addition, the present invention provides a semiconductor device having high insulating reliability by using the electronic device.

BEST MODE FOR CARRYING OUT THE INVENTION

Embodiments of the present invention will be explained in detail with reference to figures.

Structure of an Electronic Device

Figure 1:
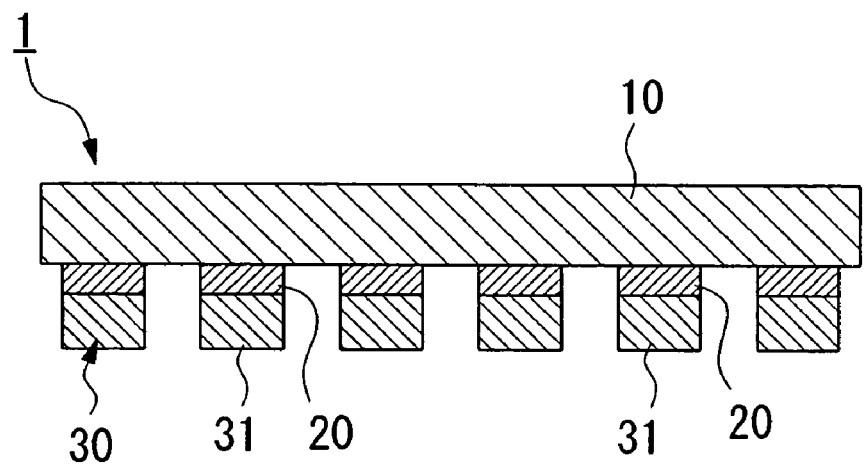
FIG. 1 is a drawing showing an electronic device of the present invention.

First, a structure of an electronic device of the present invention will be explained with reference to FIG. 1. FIG. 1 is a cross-sectional drawing showing an electronic device when the electronic device is cut in a vertical direction with respect to the surface of an insulating base.

In an electronic device 1, a circuit 30, which is formed by pattern formation of metal portions 31, is attached via an adhesive layer 20 to an insulating base 10. The differences between the electronic device 1 shown in FIG. 1 and a conventional electronic device are that the adhesive layer 20 is formed only between the circuit 30 and the insulating base 10, and that the adhesive layer 20, which contacts adjacent metal portions 31, is divided.

The electronic device 1 includes, for example, a lead frame comprising a lead frame fixing tape, a TAB (Tape Automated Bonding) tape, and a flexible printed circuit board, etc.

The insulating base 10 is not limited to, but preferable insulating base 10 includes heat resistant films or tapes made of polyimide, poly ethylene naphthalate, poly ethylene terephthalate, poly ether sulfone, polyetheretherketone, poly phenylene sulfide, fluoro ethylene propylene, and liquid crystal polymers; nonwoven fabrics or papers in which phenol resin is impregnated; and glass cloths in which epoxy resin or bismaleimide triazine resin is impregnated.

Among these, films or tapes made of polyimide are preferable, because they have better heat resistance. A commercially available polyimide film includes UPILEX®-S marketed by Ube Industries, Ltd., KAPTON®-H, KAPTON®-V, and KAPTON®-EN marketed by DU PONT-TORAY CO., LTD., APICAL®-NPI, APICAL®-HP, and APICAL®-AH marketed by Kaneka Corporation.

Any materials can be used as an adhesive for the adhesive layer 20 as long as it adheres between the insulating base 10 and the circuit 30 and it has insulating properties. However, for example, resin compositions containing flexible resin such as polyamide resin and hard resin such as phenol resin as main components and epoxy resin, imidazole, etc.

Among these, a resin composition containing polyamide resin formed by $C_{36}$-dimer acid, solid phenol resin at room temperature, and liquid epoxy resin at room temperature at suitable mixing ratio is preferable.

Polyamide resin having a weight average molecular weight in a range from 5,000 to 100,000 is preferable. Since cohesion of amide resin depends on carbonic acid and amine, which are row materials of polyamide resin, molecular weight, softening point, etc., of phenol resin and epoxy resin are preferably varied.

Instead of polyamide resin, polyester resin, acrylonitrile butadiene resin, polyimide resin, butyral resin, and silicone modified resin thereof may be used. In addition, instead of phenol resin and epoxy resin, maleimide resin, resol resin, triazine resin, etc., may be used.

Metal forming the circuit 30 (metal portions 31) is not limited as long as it has excellent conductivity, and it includes, for example, copper, aluminum, gold, silver, platinum, chromium, nickel, tungsten, and an alloy thereof.

The electronic device 1 in this embodiment has a structure in which the adhesive layer 20, which contacts adjacent metal portions 31, is divided. Therefore, even when metal of the circuit 30 is ionized and migrates into the adhesive layer 20, there is absolutely no fear that metal portions 31 forming the circuit 30 will be electrically conductive with each other via the adhesive layer 20. The electronic device 1 in this embodiment has extremely high insulating reliability. A semiconductor device having high insulating reliability can be produced by using such an electronic device 1 having extremely high insulating reliability.

Since the problem in that metal forming the circuit is ionized and migrates into the adhesive layer is serious in high-temperature low-humidity conditions or high-temperature high-humidity conditions, the electronic device 1 and the semiconductor device comprising the electronic device 1 of this embodiment are particularly suitably used in these conditions.

Figure 2:
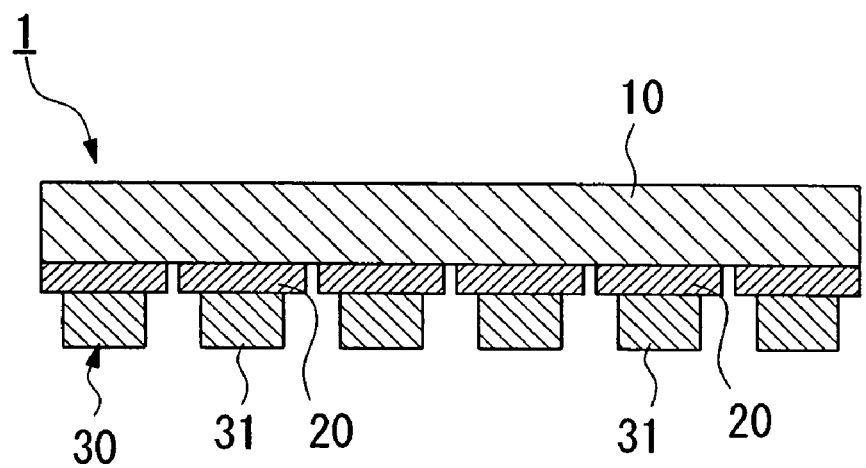
FIG. 2 is a drawing showing another electronic device of the present invention.

This embodiment has a structure in that there is absolutely no adhesive layer 20 between adjacent metal portions 31. However, as long as the adhesive layer 20, which contacts adjacent metal portions 31, is divided, the adhesive layer 20 may be formed between adjacent metal portions 31 as shown in FIG. 2, Production Method for Electronic Device Below, production methods for the electronic device of the present invention will be explained. In this embodiment, the production method for the electronic device 1 as shown in FIG. 1 is explained.

Figure 3A:
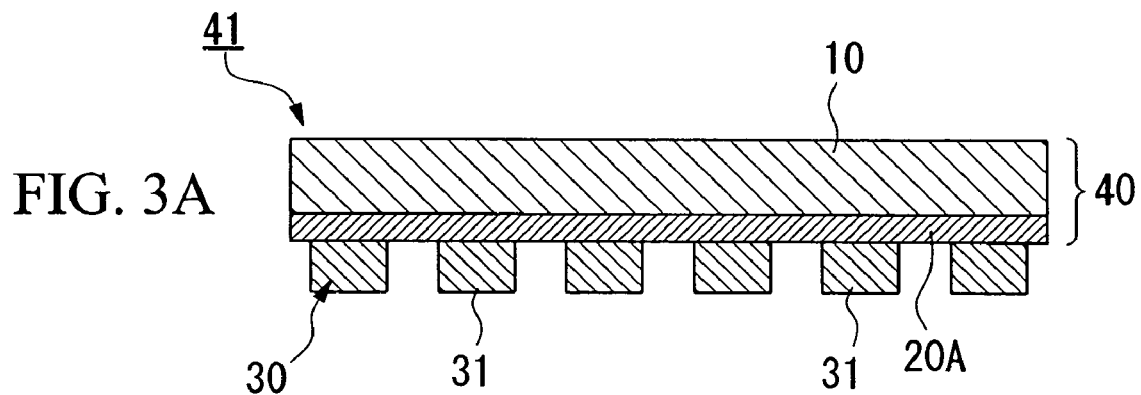
FIGS. 3A to 3C are process drawings showing a production method for the electronic device of the present invention.

First, as shown in FIG. 3A, an insulating base 40 comprising an adhesive layer, in which an adhesive layer 20A is formed on the entirety of one surface of an insulating base 10, is prepared. The insulating base 40 comprising an adhesive layer is sold commercially. A commercially available insulating base comprising an adhesive layer includes, for example, adhesive tapes such as ELEPHANE®-R722 and tapes for a TAB such as ELEPHANE®-FCX, which are marketed by TOMOEGAWA PAPER Co., Ltd. Instead of using a commercially available insulating base comprising an adhesive layer, an insulating base comprising an adhesive layer may be prepared by coating an adhesive on an insulating base and tack-drying the adhesive.

Next, as shown in the figure, the circuit 30, in which metal portions 31 are pattern formed, is formed on the surface of the adhesive layer 20A of the insulating base 40 comprising an adhesive layer. The circuit 30 is formed by adhering a metal foil such as a copper foil to the insulating base 40 comprising an adhesive layer, and patterning the metal foil. A pattern formation of a metal foil can be performed by photolithography in which a photoresist film is formed, exposed, and developed, and then the metal foil is etched, and after that the photoresist film is peeled off. The circuit 30 may be formed on the surface of the insulating base 40 comprising an adhesive layer by adhering a lead frame, etc., which comprises a circuit having a fixed pattern, is formed in advance, instead of a metal foil.

As explained above, a layered product 41, in which the adhesive layer 20A of which is not pattern formed and the circuit 30 are layered on the surface of the insulating base 10 in this order, is prepared.

In the present invention, a shape or a size of the circuit comprising pattern formed metal portions, the adhesive layer, and the insulating base is not limited.

Figure 3B:
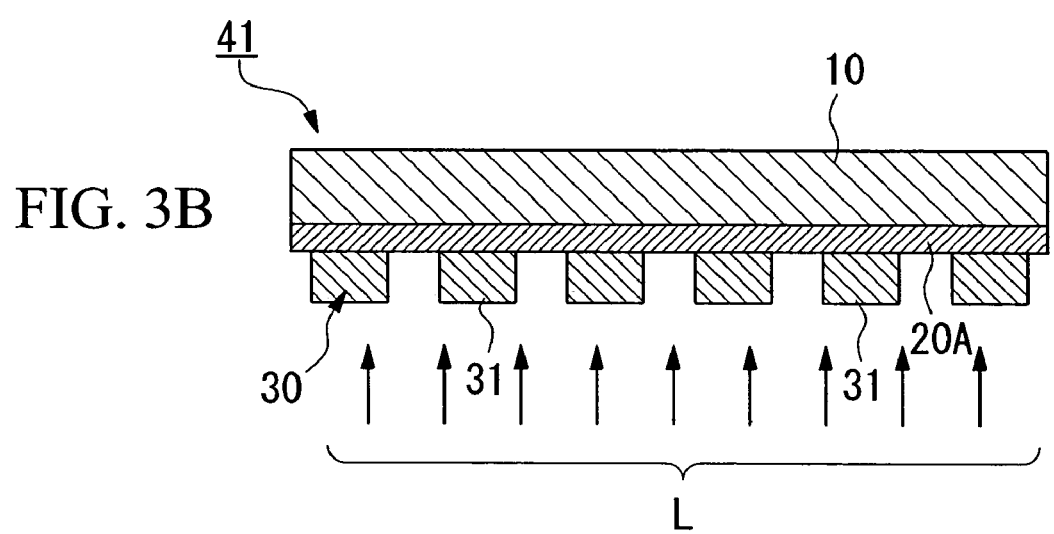

Next, as shown in FIG. 3B, a laser L, which can selectively etch (eliminate) the adhesive layer 20A, is irradiated from the circuit side on the entire surface of the layered product 41. A laser, which can selectively etch only the adhesive layer 20A containing organic materials without etching the circuit 30 made of metal, may be an excimer laser, etc.

Since an irradiated area per one pulse of a laser L can be adjusted, the layered product 41 is divided into a plurality of regions and the laser is irradiated on each region or the laser is irradiated on the entire surface of the layered product 41 at one time. In particular, since work steps can be reduced, the laser is preferably irradiated on the entire surface of the layered product 41 at one time.

Figure 3C:
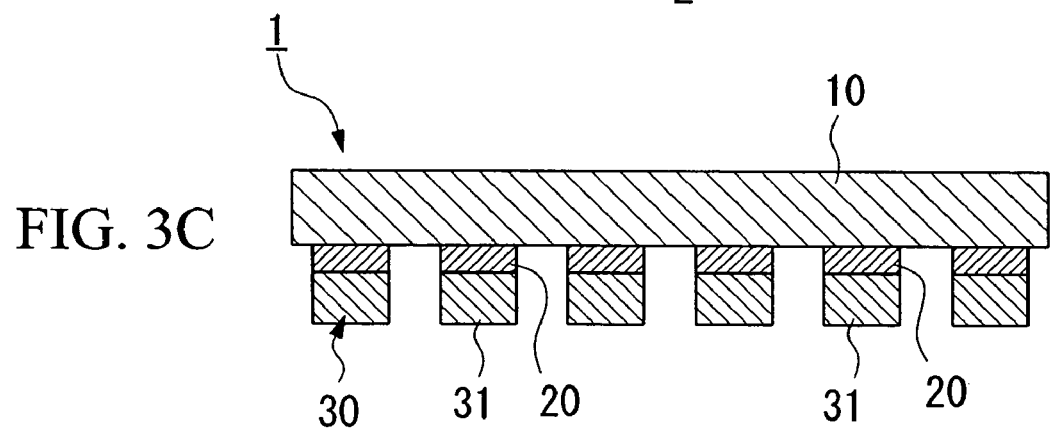
Figure 4:
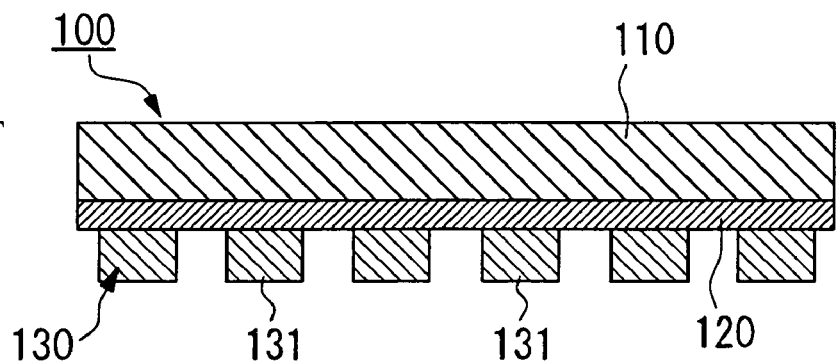
FIG. 4 is a drawing showing a conventional electronic device.

When specific laser L is irradiated on the entire surface of the layered product 41, the circuit 30 acts as a mask, as shown in FIG. 3C, and the adhesive layer 20A, on which the circuit 30 is not formed, is selectively eliminated. Thereby, only the adhesive layer 20A between the circuit 30 and the insulating base 10 remains. As a result, the adhesive layer 20 is formed only between the circuit 30 and the insulating base 10, and the electronic device 1, in which the adhesive layer 20 contacting adjacent metal portions 31, is divided, is produced.

Instead of laser irradiation over a large area at one time, the laser beam may be scan-irradiated. When the laser beam is scan-irradiated, the laser beam is selectively irradiated on the adhesive layer 20A between adjacent metal portions 31, and the adhesive layer 20A is divided. In this case, since the laser is irradiated on only the adhesive layer 20A, a laser, which etches not only organic materials but also metal, may be used. When such a laser is used, the adhesive layer 20A between adjacent metal portions 31 is partially eliminated, and thereby the electronic device 1 as shown in FIG. 2 can be produced.

According to the production method for an electronic device of this embodiment, after a circuit is formed using an existing insulating base comprising an adhesive layer in a conventional manner, the electronic device of the present invention, in which the adhesive layer contacting adjacent metal portions of the circuit is divided, can be produced by a simple operation such as by irradiating with a laser. Therefore, since the electronic device of the present invention can be produced without large changes in current processes, the production method for an electronic device of this embodiment is preferable.

Another Production Method for an Electronic Device

The electronic device of the present invention can be produced by another production method besides the production method in the above embodiment.

For example, the electronic device of the present invention can be produced by preparing a lead frame, etc., comprising a fixed patterned circuit, forming the adhesive layer by pattern formation on the patterned circuit, and then the insulating base is attached on the adhesive layer. The electronic device of the present invention can also be produced by forming the adhesive layer by pattern formation on the surface of the insulating base such that the adhesive layer, which contacts adjacent metal portions of the circuit, be divided, and then the circuit is formed.

The method for pattern formation of the adhesive layer includes a printing method, a dispensing method, etc.

This is because if these production methods are used, a step for patterning the adhesive layer formed on the entire surface of the insulating base is not needed, and there is an effect that the amount of adhesive used is reduced.

Below, examples and comparative examples of the present invention are explained.

EXAMPLE 1

An adhesive tape (ELEPHANE®-R722, marketed by TOMOEGAWA PAPER Co., Ltd.), in which an adhesive layer is formed on the entirety of one surface of an insulating base, was punched, and thereby a lead frame fixing tape having a frame shape of an outer size of 20 mm×20 mm, an inner size of 10 mm×10 mm, and a thickness of 5 mm was prepared. Then, a 208-pin lead frame was put on the adhesive layer of the prepared tape, and the layered product was prepared by pressing and adhering them while heating at 160° C. for 1 second.

After that, an excimer laser was irradiated at one time from the lead frame side on the entire surface of the layered product, and thereby the adhesive layer, on which the lead frame did not exist, (that is, the adhesive layer between pins) was removed. Finally, the electronic device (lead frame comprising a lead frame fixing tape) was produced by heating the product in a hot air circulation type dryer at 150° C. for 1 hour, and thereby the adhesive layer was hardened.

EXAMPLE 2

A tape for TAB (ELEPHANE®-FCX, marketed by TOMOEGAWA PAPER Co., Ltd.), in which an adhesive layer is formed on the entirety of one surface of an insulating base, and a ¾ ounce electrolytic copper foil were adhered via the adhesive layer. Then, this was heated in a hot air circulation type dryer at 70° C. for 6 hours, at 120° C. for 6 hours, and at 160° C. for 6 hours in this order, and thereby the adhesive layer was hardened. After that, on the copper foil, a photoresist film was formed, exposed, and developed, and the copper foil was etched, and the photoresist film was peeled off, and thereby the copper foil was patterned formed, and the circuit was prepared.

After that, excimer laser was irradiated at one time from the circuit side on the entire surface of the layered product, and thereby the adhesive layer, on which the lead frame did not exist, was removed, and thereby the electronic device (TAB tape) was produced.

EXAMPLE 3

An adhesive layer was prepared by coating an adhesive varnish (varnish for ELEPHANE®-R722, marketed by TOMOEGAWA PAPER Co., Ltd.) in a dispensing method on a 208-pin lead frame tape, heating and drying it in a hot air circulation type dryer at 150° C. for 3 minutes. Then, a polyimide film (KAPTON®-200H, marketed by DU PONT-TORAY) was punched, and thereby a lead frame fixing tape having a frame shape of an outer size of 20 mm×20 mm, an inner size of 10 mm×10 mm, and a thickness of 5 mm was prepared. Then, the prepared lead frame fixing tape was put on the adhesive layer, and the layered product was prepared by pressing and adhering them while heating at 160° C. for 1 second. Finally, the electronic device (lead frame comprising a lead frame fixing tape) was produced by heating the product in a hot air circulation type dryer at 150° C. for 1 hour, and thereby the adhesive layer was hardened.

EXAMPLE 4

An adhesive layer was prepared by coating an adhesive varnish (varnish for ELEPHANE®-R722, marketed by TOMOEGAWA PAPER Co., Ltd.) in a screen printing method on a 208-pin lead frame tape, heating and drying it in a hot air circulation type dryer at 150° C. for 3 minutes.

Then, a polyimide film (KAPTON®-200H, marketed by DU PONT-TORAY) was punched, and thereby a lead frame fixing tape having a frame shape of an outer size of 20 mm×20 mm, an inner size of 10 mm×10 mm, and a thickness of 5 mm was prepared. Then, the prepared lead frame fixing tape was put on the adhesive layer, and the layered product was prepared by pressing and adhering them while heating at 160° C. for 1 second. Finally, the electronic device (lead frame comprising a lead frame fixing tape) was produced by heating the product in a hot air circulation type dryer at 150° C. for 1 hour, and thereby the adhesive layer was hardened.

COMPARATIVE EXAMPLE

A comparative electronic device was prepared in a manner identical to that of Example 1, except that no excimer laser was irradiated.

Evaluation Tests and Evaluation Results

The following electrical insulating reliability test was conducted using the electronic devices prepared in Examples and Comparative Example.

The electronic devices were put in an atmosphere in which the temperature was 130° C., relative humidity was 85%, and pressure was 2 atmosphere (about 2026 hPa). The time from the electronic device was put in the atmosphere to a dielectric breakdown was generated and an electrical current started to flow between the metal portions was measured. The applied voltage was adjusted to 10 V.

In the electrical devices in Examples 1 to 4, comprising the adhesive layer formed such that the adhesive layer, which contacts adjacent metal portions of the circuit, is divided, resistance did not change after 2,000 hours, and an electrical current did not flow between the metal portions of the circuit. It was confirmed that the electrical devices in Examples 1 to 4 have high insulating reliability. In contrast, in the comparative electrical device comprising no adhesive layer, shorts were generated between the metal portions of the circuit after 336 hours. It was confirmed that the electrical device has low insulating reliability.

The invention claimed is:

1. A production method for an electronic device in which a circuit formed by pattern formation of metal portions is attached via an adhesive layer having insulating properties to an insulating base comprising the steps of:

forming a layered product comprising the insulating base, the adhesive layer having insulating properties of which is not pattern formed yet, and the circuit in which metal portions are pattern formed, which are layered in this order;

irradiating an excimer laser, which can selectively eliminate the adhesive layer, from the circuit side on the layered product, so that the adhesive layer, which contacts adjacent metal portions, is divided and the adhesive layer attached to the circuit is isolated from other adhesive layers attached to other circuits.

2. A production method for an electronic device in which a circuit formed by pattern formation of metal portions is attached via an adhesive layer having insulating properties to an insulating base comprising the steps of:

forming a layered product comprising the insulating base, the adhesive layer having insulating properties of which is not pattern formed yet, and the circuit in which metal portions are pattern formed, which are layered in this order; and selectively irradiating an excimer laser on the adhesive layer between adjacent metal portions, so that the adhesive layer, which contacts with the adjacent metal portions, is divided and the adhesive layer attached to the circuit is isolated from other adhesive layers attached to other circuits.

3. A production method for an electronic device in which a circuit formed by pattern formation of metal portions is attached via an adhesive layer having insulating properties to an insulating base comprising the steps of:

forming the adhesive layer having insulating properties by pattern formation on the circuit formed by pattern formation of metal portions so that the adhesive layer attached to the circuit is isolated from other adhesive layers attached to other circuits; and attaching the insulating base on the adhesive layer.

4. A production method for an electronic device according to claim 3, wherein the adhesive layer is pattern formed by a printing method or a dispensing method.

5. A production method for an electronic device in which a circuit formed by pattern formation of metal portions is attached via an adhesive layer having insulating properties to an insulating base comprising the steps of:

forming a layered product comprising the insulating base, the adhesive layer having insulating properties of which is not pattern formed yet, and the circuit in which metal portions are pattern formed, which are layered in this order;

irradiating an excimer laser, which can selectively eliminate the adhesive layer, from the circuit side to the entire of the layered product, so that the adhesive layer, which contacts adjacent metal portions, is divided and the adhesive layer attached to the circuit is isolated from other adhesive layers attached to other circuits.

* * * * *